Feb. 9, 1971 D. L. RODE 3,562,666
SELF-RESONANT LSA MICROWAVE OSCILLATOR DEVICES
Filed June 23, 1969 2 Sheets-Sheet 1

INVENTOR
D. L. RODE
BY
R B Anderson
ATTORNEY

SELF-RESONANT LSA MICROWAVE OSCILLATOR DEVICES

Filed June 23, 1969

2 Sheets-Sheet 2

United States Patent Office 3,562,666
Patented Feb. 9, 1971

3,562,666
SELF-RESONANT LSA MICROWAVE OSCILLATOR DEVICES
Daniel L. Rode, Murray Hill, N.J., assignor to Bell Telephone Laboratories, Incorporated, Murray Hill and Berkeley Heights, N.J., a corporation of New York
Filed June 23, 1969, Ser. No. 835,434
Int. Cl. H03b 7/14
U.S. Cl. 331—96 7 Claims

ABSTRACT OF THE DISCLOSURE

A cylindrical bulk-effect diode of appropriate doping and diameter is self-resonant at the LSA frequency, thereby eliminating the need for the normally required external resonator of an LSA oscillator. If the diode is gallium arsenide, the product of frequency and diameter should be $2.2\times10^9$ cm./sec. and the ratio of doping to frequency should be $5.4\times10^4$ sec./cm.$^3$. These values can be adjusted by surrounding the diode with an appropriate hollow dielectric cylinder. When properly biased, the diode radiates microwave energy at the LSA frequency.

BACKGROUND OF THE INVENTION

This invention relates to bulk-effect devices, and more particularly, to limited space-charge accumulation (LSA) devices that may be used as microwave sources.

The patent of J. B. Gunn, 3,365,583, described a family of bulk-effect devices, each comprising a wafer of appropriate semiconductor material such as gallium arsenide, in which traveling domain oscillations can be excited through the application of a bias voltage above a prescribed threshold value. These traveling domains result from a known mechanism of electron transfer between conduction band valleys which establishes a negative differential resistance to internal currents in the wafer, and are manifested by oscillatory currents in the output terminals, now generally known as Gunn-effect oscillations.

The copending application of J. A. Copeland III, Ser. No. 564,081, filed July 11, 1966, and assigned to Bell Telephone Laboratories, Incorporated, and the paper by J. A. Copeland III, "LSA Oscillator-Diode Theory," Journal of Applied Physics, vol. 38, No. 8, July 1967, pages 3096–3101, describe how a mode of oscillation called the LSA mode (for limited space-charge accumulation), can be induced in bulk-effect diodes of the general type described in the Gunn patent. This new mode of oscillation is not dependent on the formation of traveling domains, its frequency is not dependent on wafer length, and as a result, the oscillator does not have the frequency and power limitations of the Gunn oscillator. The LSA mode oscillator includes a bulk semiconductor diode, a resonant circuit and a load, the various parameters of which are adjusted such that the electric field intensity within the diode alternates between a high value at which negative resistance occurs, and a lower value at which the diode displays a positive resistance. By appropriately adjusting the duration of electric field excursions into the positive and negative resistance regions of the diode, one can prevent the formation of traveling domains responsive for Gunn-effect oscillation, while still obtaining the negative resistance required for sustained oscillations.

SUMMARY OF THE INVENTION

I have found that it is possible to fabricate a cylindrical bulk-effect diode such as to be self-resonant at the LSA frequency and to fulfill all conditions for LSA mode operation. Self-resonance is possible because the interface between the semiconductor and the surrounding space inherently constitutes a partially reflecting surface which reflects internally generated energy back toward the central axis of the wafer. By making the wafer cylindrical and of appropriate doping density and diameter, this reflection establishes a resonance that fulfills the LSA conditions. If the wafer is of gallium arsenide, the product of frequency and diameter should be $2.2\times10^9$ cm./sec. and the ratio of doping to frequency should be $5.4\times10^4$ sec./cm.$^3$. A more general statement that covers any bulk-effect or two-valley material will be given hereinafter.

Since no external circuitry is required, and since most internally generated energy is transmitted through the semiconductor-air interface, the diode continuously radiates microwave energy during operation. This radiated energy can conveniently be collimated, or directed in parallel lines, by locating the diode at the focus of a parabolic antenna. Alternatively, the generated energy can be directed along a coaxial cable by locating the diode at one focus of an elliptical cavity resonator with the inner conductor of the coaxial cable located at the other focus.

For a bulk-effect diode consisting of gallium arsenide, the above dependence of diode diameter on frequency requires diodes for low frequency operation to be a few times too large to allow continuous oscillations, although pulsed oscillations are feasible. In accordance with another feature of the invention, greater flexibility of design for continuous operation is achieved by surrounding the diode with a dielectric annulus. The distance between the diode surface and the inner surface of the annulus should be a quarter wavelength at the generated LSA frequency and the distance between the inner and outer surfaces of the annulus should also be a quarter wavelength. With these conditions met, both interfaces of the annulus with the surrounding space will constitute partially reflecting surfaces and the outer diameter of the diode wafer may be made sufficiently small to allow continuous operation.

These and other objects and features of the invention will be better understood from a consideration of the following detailed description taken in conjunction with the accompanying drawing.

DRAWING DESCRIPTION

DETAILED DESCRIPTION

Figure 1:
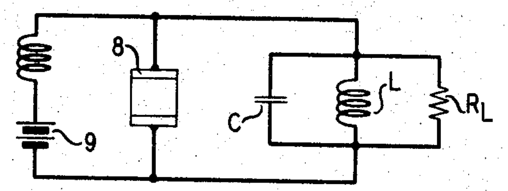
FIG. 1 PRIOR ART
FIG. 1 is a schematic diagram of an LSA oscillator circuit of the prior art.

Referring now to FIG. 1, there is shown a schematic diagram of an LSA oscillator circuit of the prior art comprising a bulk-effect diode 8 biased by voltage source 9. The diode comprises a wafer of bulk-effect semiconductor material, such as n-type gallium arsenide, contained between opposite ohmic contacts. Coupled to the diode is a parallel resonant circuit comprising a capacitance C, an inductance L and a load resistance $R_L$. The purpose of LSA operation is to take advantage of the negative resistance of bulk-effect diodes to generate high frequency oscillations across the load resistance $R_L$ without permitting traveling domains to form within the diode wafer as is characteristic of Gunn-effect operation, thus realizing substantial advantages in terms of attainable frequency and power.

Figure 2:
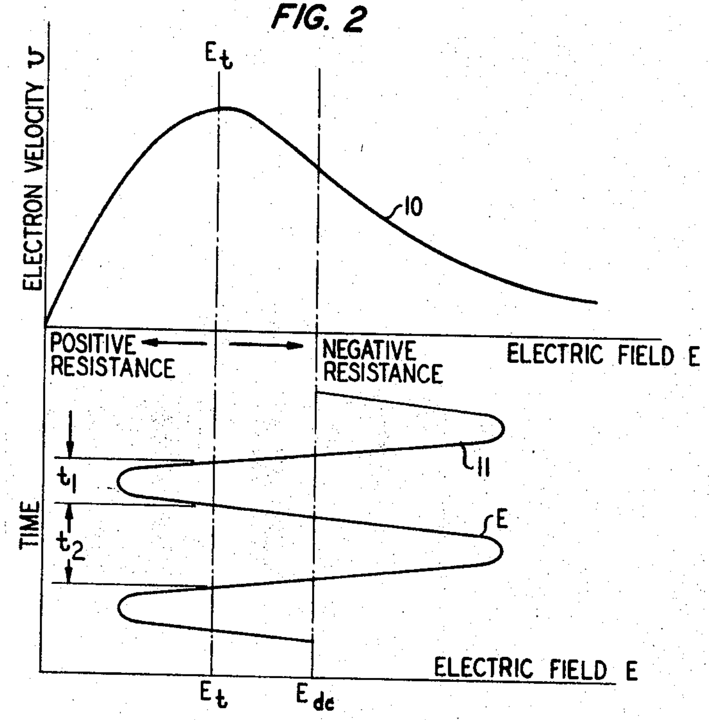
FIG. 2 illustrates graphs of electron velocity versus electric field, and time versus electric field in the diode of the circuit of FIG. 1.

One requirement of LSA operation is that the diode specimen be of substantially uniform constituency and be doped in a known manner to give a negative resistance characteristic as shown by curve 10 of FIG. 2. For purposes of this application, the term bulk-effect device shall mean any semiconductor device having a carrier velocity versus electric field characteristic of the general type shown by curve 10. For n-type materials, the carrier velocity refers to electron velocity and for p-type materials it refers to hole velocity. At applied bias fields in excess of its threshold voltage $E_t$, the specimen displays a negative resistance, while at fields lower than $E_t$, it displays a positive resistance. If a steady D-C voltage in excess of $E_t$ were applied to the specimen, traveling domain oscillations would be excited as is described generally in the Gunn patent.

While the direct-current electric field $E_{dc}$ applied to the specimen by D-C source 9 exceeds the threshold voltage $E_t$, the external tank circuit and load resistance $R_L$ causes the actual electric field E in the specimen to oscillate as is shown by curve 11 of FIG. 2. During the time interval $t_1$ of each cycle of E, the electric field in the diode extends below the threshold voltage $E_t$ into the positive resistance region of the diode, while during the remaining portion of the cycle $t_2$, it extends into the negative resistance region above $E_t$. The frequency of E is determined by the oscillator resonant circuit, while the amplitude is a function of the load resistance $R_L$ of the circuit.

During the negative resistance period, R-F energy grows exponentially as it propagates through the diode, which more than compensates for its attenuation during the positive resistance portion, thus giving a net gain. As has been described previously in the literature, the gain of the device will exceed its attenuation if the following relation is satisfied:

$$\frac{1}{t_1+t_2}\int^{(t_1+t_2)} Evdt < E_{dc}v_a \qquad (1)$$

where the integral is taken over one cycle, E is the electric field, $v$ is the carrier velocity, $v_a$ is the average carrier drift velocity in the wafer during oscillation, $t_1$ is the time interval during each cycle in which the diode is in a positive resistance condition, $t_2$ is the time interval during each cycle in which the diode is in a negative resistance condition and $E_{dc}$ is the direct current bias electric field. Traveling domains in the wafer are prevented by making the time interval $t_2$ small enough so that space-charge accumulation cannot occur in that time interval, and by making $t_1$ long enough to attenuate space-charge accumulation to prevent it from growing with succeeding cycles. To meet these requirements, the following relationships should also be satisfied:

$$\frac{ne}{\epsilon}\int^{(t_2)} |\mu| dt < 10 \qquad (2)$$

$$\frac{ne}{\epsilon}\int^{(t_1)} |\mu| > \frac{ne}{\epsilon}\int^{(t_2)} |\mu| dt \qquad (3)$$

where $\int^{(t_2)}$ is the integral taken over the time period, $t_2$, $\epsilon$ is the permittivity of the wafer, $\mu$ is the differential mobility of the wafer, $e$ is the charge on a majority carrier and $\int^{(t_1)}$ is the integral taken over the time period $t_1$.

The prior art further teaches that in order to give the oscillating field E sufficient amplitude to extend into the positive resistance region and to rise sharply into the negative resistance region, the load resistance should be sufficiently high. In the circuit of FIG. 1, load resistance $R_L$ should conform to the relationship $$R_L > \frac{l}{n_0|\mu_2|eA} \qquad (4)$$

where $l$ is the length of the wafer between opposite contacts, $n_0$ is the doping level or average carrier concentration of the wafer, A is the area of the sample in the plane transverse to the drift current and $\mu_2$ is the average negative mobility in the negative resistance region which is given by $$|\mu_2| = \frac{1}{t_2}\int^{(t_2)} |\mu| dt \qquad (5)$$

With fulfillment of the above conditions, the oscillator of FIG. 1 operates in the LSA mode and gives the well-recognized advantages of LSA operation. The application of J. A. Copeland III, Ser. No. 612,598, filed Jan. 30, 1967, now Pat. No. 3,414,841, and assigned to Bell Telephone Laboratories, Incorporated, points out that oscillations may be initiated either by transient effects or by applying a burst of R-F energy.

Figure 3:
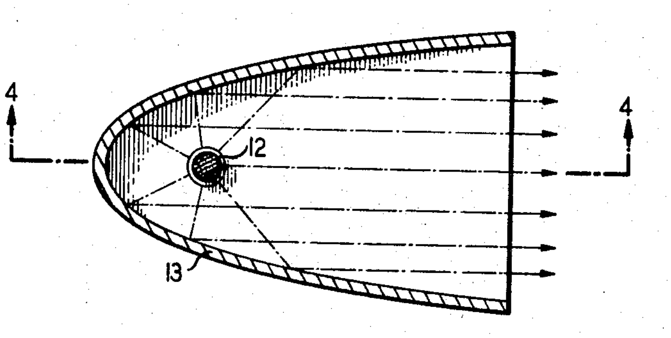
FIG. 3 is a schematic diagram of an LSA diode oscillator mounted in a parabolic antenna in accordance with an illustrative embodiment of the invention.
Figure 4:
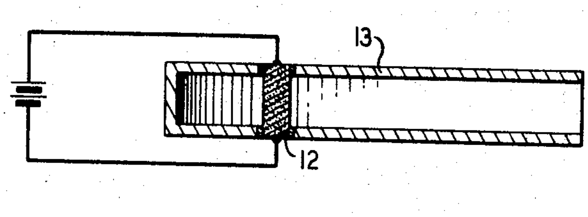
FIG. 4 is a view taken along lines 4—4 of FIG. 3.

Referring now to FIGS. 3 and 4, there is shown a microwave source comprising a bulk-effect diode 12 mounted at the focus of a parabolic antenna 13. The wafer of the diode is cylindrical and is of an appropriate diameter with respect to the carrier concentration $n$ to be self-resonant at a frequency that satisfies the conditions for LSA operation. Because of its self-resonance and its symmetrical configuration, internally generated R-F energy is radiated as shown and collimated by the antenna 13.

Figure 5:
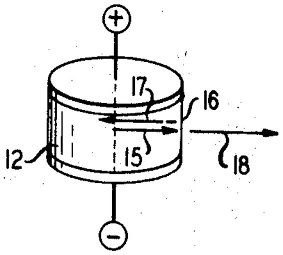
FIG. 5 is a schematic perspective view of the diode of FIGS. 3 and 4.

FIG. 5 shows schematically how, by the establishment of an internal resonance within the diode 12, LSA operation is achieved without any external resonant circuitry. When biased above threshold, transients will cause an electric field component 15 to propagate radially as shown and, because of the differential negative resistance, the component will experience gain. When the component reaches the surface 16 of the semiconductor wafer, it is partially reflected due to the impedance mismatch at the interface of the semiconductor with the surrounding air or free space. In the language of optics, a refractive index mismatch at surface 16 causes partial reflection. The reflected component 17 travels back toward the central axis while the unreflected component 18 is radiated from the wafer. It can intuitively be appreciated that, if the process described is allowed to continue, repeated reflection along with repeated gain of reflected components establishes a resonance within the cylindrical wafer surface. Moreover, this internal resonance may be designed to fulfill the conditions for LSA operation, thus precluding the formation of traveling domains within the wafer without providing an external resonant circuit as is normally required.

Oscillation will continue only if the "round-trip" gain of the reflected component equals the loss due to partial transmission. That is, the gain of reflected component 17 must compensate for the loss of internal energy due to radiation of component 18. In general, if the diode diameter is too small or if wafer doping is too low, the net gain will not overcome the loss due to transmitted power and the oscillation will rapidly disappear. On the other hand, a doping level that is too high will cause oscillation instabilities inconsistent with LSA operation.

The most commonly used material for bulk-effect negative resistance devices is gallium arsenide. It can be shown mathematically that, when gallium arsenide is used as the semiconductor wafer, the above considerations lead to specific requirements which must be substantially met to give operation as described:

$$f \times d = 2.2 \times 10^9 \text{ cm./sec.} \qquad (6)$$

$$n/f = 5.4 \times 10^4 \text{ sec./cm.}^3 \qquad (7)$$

where $f$ is the frequency of operation, $d$ is the diameter of the wafer and $n$ is the carrier concentration or doping density of the wafer. Combining Equations 6 and 7 gives $$n \times d = 11.88 \times 10^{13} \text{ cm.}^{-2}$$

Equations 6 through 8 are derived from a more general statement that defines the condition for LSA self-resonance regardless of material:

$$\chi \frac{J_n(\chi)'}{J_n(\chi)} = \frac{H_n^{(1)}(\rho)'}{H_n^{(1)}(\rho)} \quad (9)$$

where $\chi$ is given by $$\chi = \pi f d \sqrt{\epsilon \mu_0} \quad (10)$$

where $f$ is the frequency, $\mu_0$ is the permeability of free space and $\epsilon$ is the complex permittivity of the wafer. $\rho$ is given by the relationship $$\rho = \pi f d \sqrt{\epsilon_0 \mu_0} \quad (11)$$

where $\epsilon_0$ is the free space permittivity. $J_n(\chi)$ is the Bessel function of $\chi$, $J_n(\chi)'$ is the first derivative of the Bessel function of $\chi$, $H_n^{(1)}(\rho)$ is the Hankel function of the first kind of $\rho$, and $H_n^{(1)}(\rho)'$ is the first derivative of the Hankel function of the first kind of $\rho$. As is known, any material having the negative resistance characteristic shown in FIG. 2 is capable of LSA operation; and if a diode of that material satisfies Equation 9, it will be capable of self-resonant LSA operation in accordance with the invention.

One advantage of the embodiment of FIG. 4, its structural simplicity, is due both to the absence of an external resonator and the fact that energy is radiated from the diode wafer. Perhaps a more important advantage is that the usual external resonator losses are avoided. The embodiment is particularly advantageous for use at frequencies in excess of 100 gigahertz because one avoids the problems normally associated with machining high precision external circuit components.

Figure 6:
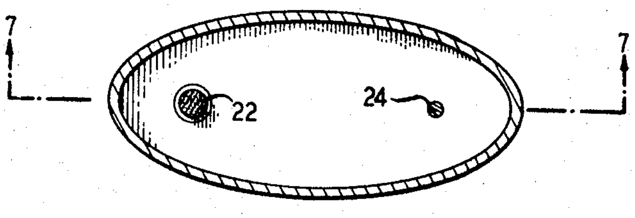
FIG. 6 is a schematic illustration showing how an elliptical cavity can be used for deriving energy from an LSA diode in accordance with another embodiment of the invention.
Figure 7:
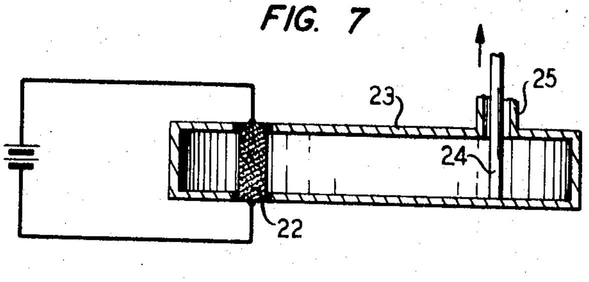
FIG. 7 is a view taken along lines 7—7 of FIG. 6.

If the device is to be operated at somewhat lower frequencies, it may be desirable to transmit output wave energy through a coaxial cable; and a convenient technique for coupling the output of a self-resonant LSA diode to a coaxial cable is shown in FIGS. 6 and 7. The diode 22, which is identical to the diode of FIG. 3, is located at one focus of an elliptical cavity 23. The inner conductor 24 of a coaxial cable 25 is located at the other focus. Since energy is radiated symmetrically from the diode 22, it is concentrated at the inner conductor 24 and is therefore efficiently transmitted out of the cavity by the cable 25 as shown by the output arrow of FIG. 7.

As is evident from Equation 6, the diode wafer diameter varies inversely with frequency and at low frequencies becomes fairly large. It can be shown that at frequencies below 120 gigahertz the diameter is large enough to create problems regarding adequate cooling or heat sinking. However, by using the structure shown in FIG. 8, one can avoid these problems by using a diode of smaller diameter than would normally be required.

Figure 8:
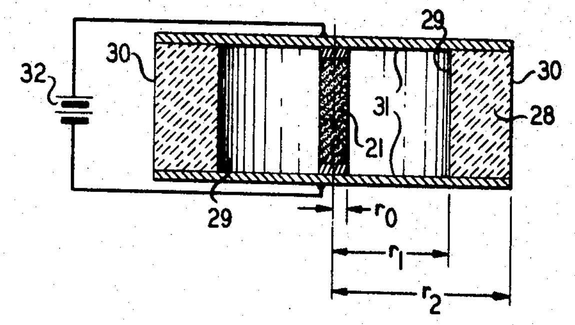
FIG. 8 is a schematic illustration of an LSA diode oscillator in accordance with still another embodiment of the invention.

The embodiment of FIG. 8 comprises a diode wafer 27 surrounded by a dielectric annulus 28 having an inner surface 29 of radius $r_1$ and an outer surface 30 of radius $r_2$. The ends of the annulus are enclosed by conductive disks 31. The bulk-effect diode wafer 27 is biased above its oscillation threshold in the usual manner by a battery 32.

The diameter $2r_0$ of the wafer 27 is smaller than that required by Equation 6 for self-resonant LSA operation. Nevertheless, the device operates in the mode because of partial reflection from surfaces 29 and 30 of the dielectric annulus 28. It can intuitively be appreciated that the distances $r_1$ and $r_2$ are important in satisfying the resonance conditions for LSA operation.

It can be shown that the optimum conditions for LSA operation will be approximately met through compliance with the following conditions:

$$r_1 = \lambda_0/4 \quad (12)$$

$$r_2 - r_1 = \lambda_0\sqrt{\epsilon_0/\epsilon_d}/4 \quad (13)$$

where $\lambda_0$ is the free space wavelength of the frequency $f$ of operation and $\epsilon d$ is the dielectric permittivity of the annulus. For a dielectric material comprising the annulus with $\epsilon d \epsilon_0 > 2$, the diameter of wafer 27 is significantly smaller than that given by Equation 6. With these conditions fulfilled, microwave energy will be emitted radially from the diode 27 through the dielectric annulus. The conductive disks 31 provide electric field shielding and preclude radiation at other angles.

While the conditions given above are approximate for making and using the structure of FIG. 8, the optimum design parameters can be determined by complying with the following more precise, relations. When the distance $r$ from the central axis equals the diode radius $r_0$ *the* following boundary condition should be met:

$$\sqrt{\epsilon}\left\{\frac{d}{dr} ln J_0(\chi)\right\}_{r=r_0} = \sqrt{\epsilon_0}\left\{\frac{d}{dr} ln[AJ_0(\rho) + iBN_0(\rho)]\right\}_{r=r_0} \quad (14)$$

where A and B are constants, $d/dr$ is the derivative with respect to radius $r$, $i$ is $\sqrt{-1}$, $J_0$ designates a Bessel function of the first kind, and $N_0$ designates a Bessel function of the second kind.

When $r = r_1$, $$\sqrt{\epsilon_0}\left\{\frac{d}{dr} ln[AJ_0(\rho) + iBN_0(\rho)]\right\}_{r=r_1} \qquad \sqrt{\epsilon_d}\left\{\frac{d}{dr} ln[EJ_0(\delta) + iFN_0(\delta)]\right\}_{r=r_1} \quad (15)$$

where $\delta$ is given by $$\delta = 2\pi f r \sqrt{\epsilon_d \mu_0} \quad (16)$$

and E and F are constants.

When $r = r_2$ $$\sqrt{\epsilon_d}\left\{\frac{d}{dr} ln[EJ_0(\delta) + iFN_0(\delta)]\right\}_{r=r_2} = \sqrt{\epsilon_0}\left\{\frac{d}{dr} ln\ H_0^{(1)}(\rho)\right\}_{r=r_2} \quad (17)$$

where $H_0^{(1)}$ designates the Hankel function of the first kind.

Simultaneous solution of Equations 14 through 17 have been carried out for annuli made of quartz, semiinsulating silicon, germanium and gallium arsenide. The latter three materials in general allow lower $n/f$ ratios and smaller diode diameters because of their relatively larger dielectric constants.

The embodiments described are intended to merely be illustrative of the concepts involved. Various other modifications and embodiments may be made by those skilled in the art without departing from the spirit and scope of the invention.

What is claimed is:

1. An oscillator comprising:

a substantially cylindrical wafer of two-valley semiconductor material having a voltage threshold of oscillation;

contacts on opposite ends of the cylindrical wafer;

means comprising a voltage source connected to the contacts for biasing the wafer beyond its oscillation threshold;

and means defining a partially reflecting surface surrounding the central axis of the wafer for reflecting oscillatory energy toward the central axis and establishing a resonant frequency appropriate for fulfilling the conditions of LSA operation.

2. The oscillator of claim 1 wherein:
the central axis of the cylindrical wafer is located at the focus of a parabolic antenna.

3. The oscillator of claim 1 wherein:
the wafer is of gallium arsenide; the partially reflecting surface is the interface of the wafer with the surrounding space;
the product of the oscillatory frequency $f$ and the diameter of the diode is approximately $2.2\times10^9$ cm./sec.;
and the ratio of wafer doping density $n$ to frequency $f$ is approximately $5.4\times10^4$ sec./cm.$^3$.

4. The oscillator of claim 1 wherein:
the parameters of the oscillator substantially comply with the following relationship $$\chi' \frac{J_n(\chi)'}{J_n(\chi)} = \rho' \frac{H_n^{(1)}(\rho)'}{H_n^{(1)}(\rho)}$$

where $\chi$ is given by $$\chi = \pi f d\sqrt{\epsilon \mu_0}$$

where $f$ is the frequency, $\mu_0$ is the permeability of free space, $\epsilon$ is the permittivity of the wafer, $d$ is the diameter of the wafer, and $\rho$ is given by the relationship $$\rho = \pi f d\sqrt{\mu_0 \epsilon_0}$$

where $\epsilon_0$ is the free space permittivity. $J_n(\chi)$ is the $n$th order Bessel function of $\chi$, $J_n(\chi)'$ is the first derivative of $J_n(\chi)$ with respect to $\chi$, $H_n^{(1)}(\rho)$ is the Hankel funtion of the first kind of $\rho$, $H_n^{(1)}(\rho)'$ is the first derivative of the Hankel function of the first kind of $\rho$.

5. The oscillator of claim 1 further comprising:
a dielectric annulus surrounding the wafer.

6. The oscillator of claim 5 wherein:
the distance between the central axis of the cylindrical wafer and the inner surface of the annulus is approximately a quarter wavelength at the operating frequency, and the distance between inner and outer surfaces of the annulus is approximately a quarter wavelength in the dielectric material comprising the annulus.

7. The oscillator of claim 4 further comprising:
a dielectric annulus surrounding the wafer;
and wherein the parameters of the oscillator substantially comply with the following relationships:

$$\sqrt{\epsilon}\left\{\frac{d}{dr} ln J_0(\chi)\right\}_{r=r_0} = \sqrt{\epsilon_0}\left\{\frac{d}{dr} ln[AJ_0(\rho)+iBN_0(\rho)]\right\}_{r=r_0}$$

$$\sqrt{\epsilon_0}\left\{\frac{d}{dr} ln[AJ_0(\rho)+iBN_0(\rho)]\right\}_{r=r_1} = \sqrt{\epsilon_d}\left\{\frac{d}{dr} ln[EJ_0(\delta)+iFN_0(\delta)]\right\}_{r=r_1}$$

$$\sqrt{\epsilon_d}\left\{\frac{d}{dr} ln[EJ_0(\delta)+iFN_0(\delta)]\right\}_{r=r_2} = \sqrt{\epsilon_0}\left\{\frac{d}{dr} ln H_0^{(1)}(\rho)\right\}_{r=r_2}$$

where A and B are constants, $d/dr$ is the derivative with respect to radius $r$, $i$ is $\sqrt{-1}$, $J_0$ designates a Bessel function of the first kind, $N_0$ designates a Bessel function of the second kind, E and F are constants, and $H_0^{(1)}$ designates the Hankel function of the first kind.

References Cited

UNITED STATES PATENTS

| | | | |
|---|---|---|---|
| 3,414,841 | 12/1968 | Copeland | 331—107G |
| 3,487,334 | 12/1969 | Eastman et al. | 331—107G |

ROY LAKE, Primary Examiner

S. H. GRIMM, Assistant Examiner

U.S. Cl. X.R.

317—234; 325—105, 178; 331—107; 333—95, 98; 343—840